United States Patent
Nakamata

(10) Patent No.: US 12,125,756 B2
(45) Date of Patent: Oct. 22, 2024

(54) SEMICONDUCTOR DEVICE

(71) Applicant: FUJI ELECTRIC CO., LTD., Kawasaki (JP)

(72) Inventor: Yuko Nakamata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 459 days.

(21) Appl. No.: 17/590,289

(22) Filed: Feb. 1, 2022

(65) Prior Publication Data

US 2022/0310466 A1 Sep. 29, 2022

(30) Foreign Application Priority Data

Mar. 24, 2021 (JP) .................................. 2021-50454

(51) Int. Cl.
| | |
|---|---|
| *H01L 23/48* | (2006.01) |
| *H01L 23/10* | (2006.01) |
| *H01L 23/29* | (2006.01) |
| *H01L 23/31* | (2006.01) |

(52) U.S. Cl.
CPC ............ *H01L 23/293* (2013.01); *H01L 23/10* (2013.01); *H01L 23/3142* (2013.01)

(58) Field of Classification Search
CPC ... H01L 23/10; H01L 23/293; H01L 23/3157; H01L 23/315; H01L 23/3142
See application file for complete search history.

(56) References Cited

U.S. PATENT DOCUMENTS

| | | |
|---|---|---|
| 2015/0076517 A1 | 3/2015 | Terai et al. |
| 2020/0043822 A1 | 2/2020 | Sakamoto et al. |
| 2021/0193546 A1 | 6/2021 | Sakamoto et al. |
| 2023/0238299 A1* | 7/2023 | Takahashi ............. C04B 37/021 257/668 |

FOREIGN PATENT DOCUMENTS

| | | |
|---|---|---|
| JP | 2013004766 A | 1/2013 |
| WO | 2013111276 A1 | 8/2013 |
| WO | 2018159678 A1 | 9/2018 |

* cited by examiner

*Primary Examiner* — Hoa B Trinh

(57) ABSTRACT

A semiconductor device in which even when cracks occur in a sealing material, the entry of moisture through the cracks can be prevented. A semiconductor device comprising a semiconductor element 11 mounted on a laminated substrate 12 and an electrically conductive connecting member, and a sealing material which seals the semiconductor element and the electrically conductive connecting member, wherein the sealing material includes a sealing layer 20 sealing members to be sealed including the laminated substrate 12, the semiconductor element 11, and the electrically conductive connecting member and including a thermosetting resin, and a protective layer 21 coating the sealing layer and including a silicone rubber, and wherein a value $A_1$ of a tensile strength × elongation at break of the sealing layer 20 is less than a value $A_2$ of a tensile strength × elongation at break of the protective layer 21, and the $A_2$ is 1600 MPa or less.

8 Claims, 4 Drawing Sheets

SEMICONDUCTOR DEVICE

CROSS-REFERENCE TO RELATED APPLICATION

This application claims priority from Japanese Patent Application No. 2021-50454, filed on Mar. 24, 2021, which is incorporated herein by reference in their entirety.

BACKGROUND OF THE INVENTION

Field of Invention

The present invention relates to a semiconductor device. In particular, the present invention relates to a semiconductor device having high reliability in which peeling and cracking of a sealing material are avoided.

Description of Related Art

Power semiconductor modules are widely used in fields in which efficient power conversion is required. The range of applications extend, for example, to the field of power electronics such as industrial equipment, electric cars, and home electric appliances. These power semiconductor modules contain a switching element and a diode, and a Si (silicon) semiconductor or a SiC (silicon carbide) semiconductor is used for the element.

A power semiconductor module is manufactured by sealing a chip including a semiconductor element and an electrically conductive connecting member such as a lead frame connected to the chip with an insulating resin sealing material. The resin sealing material includes a thermosetting resin and an inorganic filler as main components. The linear expansion coefficient of the resin itself is greater than the linear expansion coefficient of the metal member such as the lead frame. Therefore, when the semiconductor module is subjected to heat cycling or the like, high thermal stress occurs.

There is known a semiconductor device including a first sealing material that seals a semiconductor element, and a second sealing material that seals a wiring member. The second sealing material is composed of a silicone gel softer than the first sealing material (see Patent Literature 1). Patent Literature 1 discloses that the semiconductor element is sealed with the hard first sealing material to suppress the peeling of the semiconductor element, and the thermal stress on the wiring member is reduced with the soft second sealing material.

There is known a semiconductor device in which the periphery of a semiconductor element is covered with a first sealing resin, and the outside thereof is covered with a second sealing resin (see Patent Literatures 2 and 3). Patent Literatures 2 and 3 disclose that a silicone resin, an acrylic resin, or the like having an elastic modulus lower than the elastic modulus of the first sealing resin is used as the second sealing resin to prevent peeling between the sealing resin and the sealed member to prevent the occurrence of cracks in the sealing resin.

CITATION LIST

Patent Literature

[Patent Literature 1] International Publication No. WO2018/159678
[Patent Literature 2] International Publication No. WO2013/111276
[Patent Literature 3] Japanese Patent Laid-Open No. 2013-4766

SUMMARY OF THE INVENTION

However, when thermal stress is repeatedly applied to the sealing structures of conventional power semiconductor modules, the module itself may repeatedly deform (warpage, twisting, and the like), causing cracking or the like in the sealing resin. The occurrence of cracking in the vicinity of the electrode leads to problems such as a decrease in electrical insulating properties and a decrease in $T_j$ power cycle resistance.

When cracks or the like occur in the sealing resin due to deterioration of the sealing resin itself due to heat cycling or moisture absorption, or thermal stress due to heat cycling, power cycling, or the like, the peeling or deterioration of the chip and its periphery accelerates due to moisture or corrosive gas that enters from the outside through the cracks or the like, or wire breakage occurs due to crack propagation. In particular, when a primer layer is provided on wiring members such as a lead frame and a wire, a chip, or a laminated substrate surface on which the chip is mounted, moisture may react with the primer, causing problems such as peeling of primer and insulation failure.

As a result of diligent research, the present inventors have discovered that the prevention of loss of reliability due to peeling, which is impossible in conventional sealing structures, is possible with a sealing structure provided with a protective layer having predetermined physical properties that can prevent the entry of moisture through cracks, even when the cracks occur in a sealing material. Thus, the present inventors have completed the present invention.

Specifically, according to one embodiment, the present invention relates to a semiconductor device comprising a semiconductor element mounted on a laminated substrate and an electrically conductive connecting member, and a sealing material which seals the semiconductor element and the electrically conductive connecting member, in which
  the sealing material includes
  a sealing layer that seals members to be sealed comprising the laminated substrate, the semiconductor element, and the electrically conductive connecting member and includes a thermosetting resin, and
  a protective layer coating the sealing layer and comprising a silicone rubber,
  a value $A_1$ represented by a tensile strength × elongation at break of the sealing layer is smaller than a value $A_2$ represented by a tensile strength × elongation at break of the protective layer, and the value $A_2$ is 1600 MPa or less.

In the semiconductor device, the value $A_1$ and A2 preferably satisfy the following relationship:

$$A_1 < A_2 < A_1 * 25.$$

In the semiconductor device, the protective layer preferably includes an inorganic filler.
In the semiconductor device, the inorganic filler is preferably a plate-like or scale-like inorganic filler.

In the semiconductor device, the protective layer preferably has a thickness of 20 μm to 1000 μm.

In the semiconductor device, it is preferred that the thermosetting resin included in the sealing layer be an epoxy resin, that the sealing layer further include a curing agent for the epoxy resin, and that the curing agent be an acid anhydride-based curing agent.

The semiconductor device preferably includes a primer layer at an interface between the members to be sealed and the sealing layer.

In the semiconductor device, the primer layer is preferably selected from polyamide resins, polyimide resins, and polyamide-imide resins.

Advantageous Effects of Invention

According to the present invention, it is possible to provide a semiconductor device having high reliability in which even when cracks occur in a sealing layer including a thermosetting resin, a protective layer can prevent the entry of moisture to suppress peeling between the sealing layer and members to be sealed.

DESCRIPTION OF PREFERRED EMBODIMENTS

Embodiments of the present invention will be described below with reference to the drawings. However, the present invention is not limited by the embodiments described below.

According to one embodiment, the present invention relates to a semiconductor device. The semiconductor device according to this embodiment has a structure in which a semiconductor element mounted on a laminated substrate and an output terminal are connected by an electrically conductive connecting member and the semiconductor element, the output terminal, and the electrically conductive connecting member are sealed with a sealing material. The sealing material includes a sealing layer and a protective layer.

Figure 1:
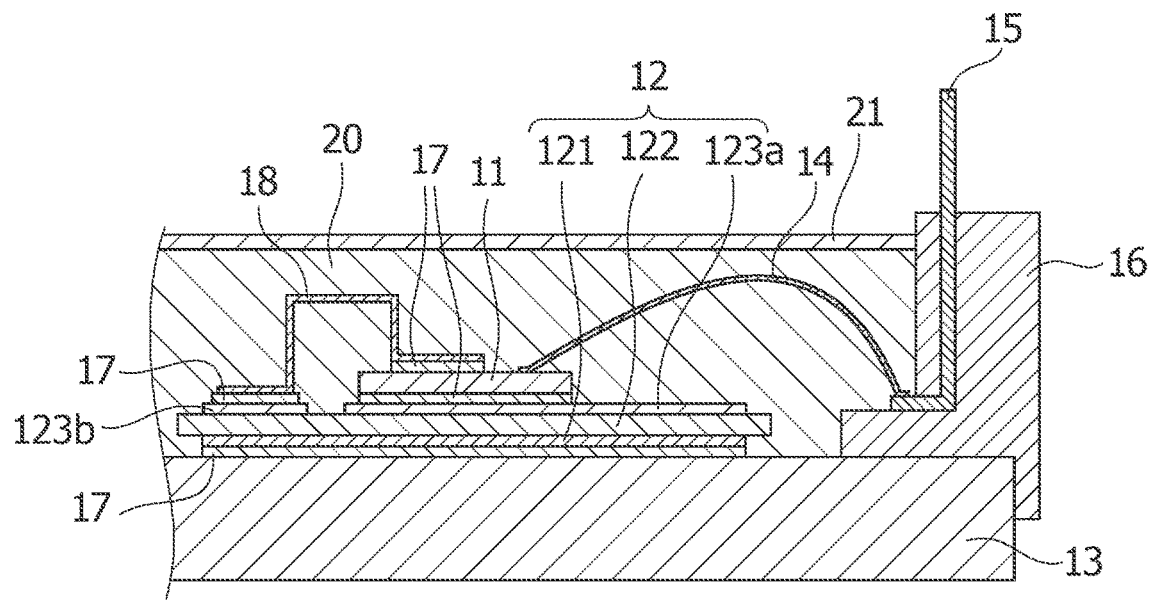
FIG. 1 is a conceptual cross-sectional view showing the cross-sectional structure of a semiconductor device according to the present invention.

FIG. 1 shows a conceptual cross-sectional view of a power semiconductor module which is one example of the semiconductor device according to this embodiment. The illustrated power semiconductor module has a laminated structure in which a semiconductor element 11 and a laminated substrate 12 are bonded on a heat sink 13 by a bonding layer 17. A case 16 containing an external terminal 15 is adhered to the heat sink 13. The semiconductor element 11 and an electrode of the laminated substrate 12 are connected by a lead frame 18, which is an electrically conductive connecting member, and the semiconductor element 11 and the external terminal 15 are connected by an aluminum wire 14. A sealing layer 20 is filled on members to be sealed, such as the semiconductor element 11, the laminated substrate 12, the lead frame 18, and the aluminum wire 14, which is an electrically conductive connecting member, in contact with the members to be sealed. Furthermore, a protective layer 21 is provided in contact with the sealing layer 20.

The semiconductor element 11 is a power chip such as an IGBT (Insulated Gate Bipolar Transistor) or a diode chip and may be a Si device or a wide gap semiconductor element such as a SiC device, a GaN device, a diamond device, or a ZnO device. These devices may be used in combination. For example, a hybrid module using a Si-IGBT and a SiC-SBD can be used. The number of mounted semiconductor elements may be one, and a plurality of semiconductor elements can also be mounted.

The laminated substrate 12 can be composed of an insulating substrate 122, a first electrically conductive plate 121 formed on one major surface of the insulating substrate 122, and second electrically conductive plates 123a and 123b formed on the other major surface. As the insulating substrate 122, a material excellent in electrical insulating properties and thermal conductivity can be used. Examples of the material of the insulating substrate 122 include $Al_2O_3$, AlN, and SiN. Particularly in high withstand-voltage applications, materials that achieve both electrical insulating properties and thermal conductivity are preferred, and AlN and SiN can be used, but the material of the insulating substrate 122 is not limited to these. As the first electrically conductive plate 121 and the second electrically conductive plates 123a and 123b, a metal material such as Cu or Al that has excellent workability can be used. The electrically conductive plates may be Cu or Al subjected to treatment such as Ni plating for the purpose of corrosion prevention and the like. Examples of the method for disposing the electrically conductive plates 121, 123a, and 123b on the insulating substrate 122 include a Direct Copper Bonding method or an Active Metal Brazing method. In the illustrated embodiment, the two second electrically conductive plates 123a and 123b are discontinuously provided on the insulating substrate 122, and one, 123a, functions as an electrode bonded to the semiconductor element 11, and the other, 123b, functions as an electrode connected to the lead frame 18.

The lead frame 18 is an electrically conductive connecting member that connects the semiconductor element 11 to the second electrically conductive plate 123*b* and the like. Specifically, the lead frame 18 is bonded to the electrode (front electrode) of the semiconductor element 11 by the bonding layer 17 such as a solder material. The lead frame 18 is also bonded to a wiring portion such as the second electrically conductive plate 123*b* by the bonding layer 17 such as a solder material. The lead frame 18 may be a metal such as copper or an alloy including copper. A Ni or Ni alloy layer or a Cr or Cr alloy layer may be formed on the surface of the lead frame 18 by a plating method or the like. In this case, the film thickness of the Ni or Ni alloy layer or the Cr or Cr alloy layer can be about 20 µm or less.

As the heat sink 13, a metal such as copper or aluminum that is excellent in thermal conductivity is used. For corrosion prevention, the heat sink 13 can also be coated with Ni or an Ni alloy. The heat sink may be a cooler having the function of water cooling, air cooling, or the like.

The bonding layer 17 can be formed using lead-free solder. For example, Sn—Ag—Cu, Sn—Sb, Sn—Sb—Ag, Sn—Cu, Sn—Sb—Ag—Cu, Sn—Cu—Ni, or Sn—Ag-based solder can be used, but the lead-free solder is not limited to these. Alternatively, the bonding layer can also be formed using a connecting material including minute metal particles, such as a sintered body of nanosilver particles.

The case 16 may be a thermoplastic resin such as polyphenylene sulfide (PPS) or polybutylene terephthalate (PBT).

In this embodiment, members including the semiconductor element 11, the laminated substrate 12, and the electrically conductive connecting members such as the lead frame 18 and the aluminum wire 14 are also referred to as members to be sealed. A sealing material is filled on the members to be sealed. The sealing material includes at least the sealing layer 20 and the protective layer 21.

The sealing layer 20 coats the periphery of the semiconductor element 11, the laminated substrate 12, and the electrically conductive connecting members in contact with these members to be sealed or via a primer layer (not illustrated). The protective layer 21 is provided in contact with the sealing layer 20 so as to cover the sealing layer 20. The protective layer 21 has the function of repairing defects in the sealing layer 20 to protect against the entry of moisture into the sealing layer 20. Generally, the protective layer 21 is not in contact with the members to be sealed, such as the semiconductor element 11, the laminated substrate 12, and the electrically conductive connecting members. In the embodiment in which the sealing material is filled into the case as in the illustrated form, the protective layer 21 constitutes the surface in contact with air. The sealing layer 20 is preferably not in contact with air. The protective layer may cover the entire surface of the sealing layer 20, but is preferably disposed at least in the boundary portion with the case and/or in the portion above the semiconductor element 11 because the boundary portion with the case is a part in which the thermal stress is highest, and the portion above the semiconductor element 11 is a part in which the temperature is likely to be higher. The portion above the semiconductor element 11 refers to the region of the surface of the sealing layer 20 generally opposed to the upper surface electrode of the semiconductor element 11. The upper surface electrode of the semiconductor element 11 refers to the electrode on the side not in contact with the laminated substrate 12, of the electrodes of the semiconductor element 11.

The sealing layer 20 is a cured product of a thermosetting resin composition, preferably an epoxy resin composition. The protective layer 21 is a cured product of a composition including a silicone rubber. The sealing layer 20 and the protective layer 21 satisfy the relational expression of physical properties represented by the following formula (1) in a state of being cured when components described later are included in the layers. When the parameter represented by the product of the tensile strength $T_1$ (MPa) and elongation at break $E_1$ (%) of the sealing layer 20 ($T_1 \times E_1$) is $A_1$ (MPa), and the parameter represented by the product of the tensile strength $T_2$ (MPa) and elongation at break $E_2$ (%) of the protective layer 21 ($T_2 \times E_2$) is $A_2$ (MPa), $A_1$ and $A_2$ satisfy the following formula (1):

$$A_1 < A_2 \tag{1}$$

wherein $A_2$ is 1600 MPa or less. The sealing layer 20 and the protective layer 21 that satisfy such physical property values are provided, and thus, even when cracks occur in the sealing layer 20, the protective layer 21 can prevent the entry of moisture into the sealing layer 20 to prevent dielectric breakdown to ensure the reliability of the semiconductor device. The lower limit value of $A_1$ is not particularly limited but is approximately 10 to 150 MPa. For example, when $A_1$ is 80 to 150 MPa, the upper limit value of $A_2$ may be 200 to 1600 MPa, and is more preferably 200 to 1000 MPa.

The values of the tensile strength $T_1$ (MPa) and elongation at break $E_1$ (%) of the sealing layer 20 can be measured according to JIS K 7161, JIS K 7162, or ASTM D 638 (tensile strength of plastic materials). The values of the tensile strength T2 (MPa) and elongation at break E2 (%) of the protective layer 21 can be measured according to JIS K 6251 or ASTM D 412 (tensile strength of rubber materials).

The sealing layer 20 and the protective layer 21 further preferably satisfy the relational expression of physical properties represented by the following formula (2):

$$A_1 < A_2 < A_1 * 25 \tag{2}$$

By setting the value of $A_2$ less than 25 times the value of $A_1$, peeling at the interface between the sealing layer 20 and the protective layer 21 can be reduced. More preferably, by setting the value of $A_2$ to less than 15 times the value of $A_1$, peeling can be further reduced. That is, even when cracking occurs in the sealing layer 20, the protective layer 21 can conform to the sealing layer 20 and elongate to ensure adhesion between the protective layer 21 and the sealing layer 20, preventing entry of moisture from outside the protective layer 21.

The thickness of the sealing layer 20 is preferably a thickness at which at least the members to be sealed, including the semiconductor element 11, the laminated substrate 12, and the electrically conductive connecting members, can be contained and insulated and sealed. A configuration in which part of the electrically conductive connecting members and the printed substrate are not sealed may be desired, depending on the mode of the semiconductor device. The thickness of the protective layer 21 is preferably 20 µm to 1000 µm, and is more preferably 100 µam to 500 µm. When the thickness of the protective layer 21 is less than 20 µm, the protective layer 21 may not work, and for example, cracks in the sealing layer 20 cannot be completely covered. When the thickness of the protective layer 21 is greater than 1000 µm, peeling may be likely to occur between the protective layer 21 and the sealing layer 20 due to thermal stress. There may be a plurality of layers that function as the protective layer 21, and in that case, the total film thickness is preferably within the above range.

The sealing layer 20 and the protective layer 21 that satisfy the above relational expression of physical properties can be selected from resin cured products that can be obtained by curing resin compositions having the following compositions.

The sealing layer 20 may be a thermosetting resin cured product obtained by curing a thermosetting resin composition that includes a thermosetting resin main agent and an inorganic filler and may optionally include a curing agent, a curing accelerator, and additives.

The thermosetting resin main agent is not particularly limited, and examples thereof can include epoxy resins, phenolic resins, and maleimide resins. In particular, epoxy resins having at least two or more epoxy groups in one molecule are particularly preferred because of high dimensional stability, water resistance and chemical resistance, and electrical insulating properties. Specifically, an aliphatic epoxy resin, an alicyclic epoxy resin, or a mixture thereof is preferably used. As the sealing resin, thermosetting resins are preferred because heat resistance and high insulating properties are requirements, and particularly epoxy resins have high elasticity and are preferred.

The aliphatic epoxy resin refers to an epoxy compound in which carbon to which an epoxy group is directly bonded is carbon constituting an aliphatic hydrocarbon. Therefore, even compounds in which an aromatic ring is included in the main skeleton are classified into aliphatic epoxy resins when they satisfy the condition. Examples of the aliphatic epoxy resin include, but are not limited to, bisphenol A type epoxy resins, bisphenol F type epoxy resins, bisphenol AD type epoxy resins, biphenyl type epoxy resins, naphthalene type epoxy resins, cresol novolac type epoxy resins, and tri- or higher functional polyfunctional epoxy resins. These can be used alone, or two or more types of these can be mixed and used. Naphthalene type epoxy resins and tri- or higher functional polyfunctional epoxy resins have high glass transition temperature and are therefore also referred to as highly heat-resistant epoxy resins. When the sealing layer 20 includes these highly heat-resistant epoxy resins, the heat resistance can be improved.

The alicyclic epoxy resin refers to an epoxy compound in which two carbon atoms constituting an epoxy group constitute an alicyclic compound. Examples of the alicyclic epoxy resin include, but are not limited to, monofunctional epoxy resins, bifunctional epoxy resins, and tri- or higher functional polyfunctional epoxy resins. The alicyclic epoxy resin can also be used alone, or two or more different alicyclic epoxy resins can be mixed and used. When an alicyclic epoxy resin is mixed with an acid anhydride curing agent and is cured, the glass transition temperature increases, and therefore, when an alicyclic epoxy resin is mixed with an aliphatic epoxy resin for use, higher heat resistance can be promoted.

The thermosetting resin main agent used in the sealing layer 20 may be a mixture of the aliphatic epoxy resin and alicyclic epoxy resin. The mixing ratio when the aliphatic epoxy resin and alicyclic epoxy resin are mixed may be freely chosen, and the mass ratio between the aliphatic epoxy resin and the alicyclic epoxy resin may be about 2:8 to 8:2, but may be about 3:7 to 7:3, and is not limited to a particular mass ratio. In a preferred mode, the thermosetting resin main agent used in the sealing layer 20 is a mixture in which the mass ratio between a bisphenol A type epoxy resin and an alicyclic epoxy resin is 1:1 to 1:4.

The inorganic filler may be a metal oxide or a metal nitride, and examples of the inorganic filler include, but are not limited to, fused silica, silica (silicon oxide), alumina, aluminum hydroxide, titania, zirconia, aluminum nitride, talc, clay, mica, and glass fibers.

These inorganic fillers can increase the thermal conductivity of the sealing layer 20 and reduce the thermal expansion coefficient. These inorganic fillers may be used alone, but two or more of these inorganic fillers may be mixed and be used. The inorganic filler may be a microfiller or a nanofiller, and two or more inorganic fillers in which the particle diameter and/or the type are different can also be mixed and be used. In particular, an inorganic filler having an average particle diameter of about 0.2 to 20 μm is preferably used. The amount of the inorganic filler added in the sealing layer 20 is preferably 100 to 600 parts by mass, further preferably 200 to 400 parts by mass, when the total mass of the thermosetting resin main agent and the curing agent that can be optionally included is 100 parts by mass. When the amount of the inorganic filler blended is less than 100 parts by mass, the thermal expansion coefficient of the sealing material may increase to easily cause peeling and cracking. When the amount blended is more than 600 parts by mass, the viscosity of the composition may increase, worsening extrudability.

The thermosetting resin composition constituting the sealing layer 20 may include a curing agent as an optional component. The curing agent is not particularly limited as long as it can react with the thermosetting resin main agent, preferably an epoxy resin main agent, to cure the thermosetting resin main agent. An acid anhydride-based curing agent is preferably used. Examples of the acid anhydride-based curing agent include aromatic acid anhydrides, specifically phthalic anhydride, pyromellitic anhydride, and trimellitic anhydride. Alternatively, examples of the acid anhydride-based curing agent can include cycloaliphatic acid anhydrides, specifically tetrahydrophthalic anhydride, methyltetrahydrophthalic anhydride, hexahydrophthalic anhydride, methylhexahydrophthalic anhydride, and methylnadic anhydride, or aliphatic acid anhydrides, specifically succinic anhydride, polyadipic anhydride, polysebacic anhydride, and polyazelaic anhydride. The amount of the curing agent blended is preferably about 50 parts by mass or more and 170 parts by mass or less, more preferably about 80 parts by mass or more and 150 parts by mass or less, based on 100 parts by mass of the epoxy resin main agent. When the amount of the curing agent blended is less than 50 parts by mass, the glass transition temperature may decrease because of insufficient crosslinking. When the amount of the curing agent blended is more than 170 parts by mass, the moisture resistance, the high thermal deformation temperature, and the heat-resistant stability may decrease. When a bisphenol A type epoxy resin is used alone, or a mixture of a bisphenol A type epoxy resin and a previously illustrated highly heat-resistant epoxy resin is used, as the thermosetting resin main agent, using no curing agent may be preferred because heat resistance is improved. The blending ratio of the highly heat-resistant epoxy resin may be, for example, 10% by mass or more and 50% by mass or less, and more preferably 10% or more and 25% by mass or less, when the total mass of the thermosetting resin main agent is 100%. This range is preferred because the heat resistance is improved, and the viscosity does not increase.

A curing accelerator as an optional component may be additionally added to the thermosetting resin composition constituting the sealing layer 20. As the curing accelerator, imidazole or a derivative thereof, a tertiary amine, a borate, a Lewis acid, an organometallic compound, an organic acid metal salt, or the like can be appropriately blended. The amount of the curing accelerator added is preferably 0.01 parts by mass or more and 50 parts by mass or less, more preferably 0.1 parts by mass or more and 20 parts by mass or less, based on 100 parts by mass of the thermosetting resin main agent.

The thermosetting resin composition constituting the sealing layer 20 may also include optional additives in a range that does not impair its characteristics. Examples of the additives include, but are not limited to, a flame retardant, a pigment for coloring the resin, and a plasticizer and a silicon elastomer for improving crack resistance. Those skilled in the art can appropriately determine these optional components and the amounts of the optional components added, according to the specifications required of the semiconductor device and/or the sealing material.

The protective layer 21 is a silicone rubber cured product that includes a silicone rubber and may optionally include an inorganic filler and additives. The silicone rubber is an organosilicon polymer in which the main chain is composed of siloxane bonds, and has higher heat resistance and also higher weather resistance and chemical resistance than conventional rubbers (organic rubbers) in which the main chain includes C—C bonds. In addition, the silicone rubber also has good stretch-fatigue properties and also generates little dust and is therefore preferred as the protective layer of the semiconductor module. Furthermore, the silicone rubber also has good adhesion to the thermosetting resin used in the sealing layer and is therefore preferred. The silicone rubber may be a molecule having a straight chain structure in which the number of siloxane bonds in one molecule after thermal curing is 5000 to 10000. The silicone rubber preferably has an elastic modulus of more than about $10^5$ Pa (0.1 MPa) and less than about 10000 MPa after thermal curing. The silicone rubber further preferably has an elastic modulus of about 1 MPa or more and less than 5000 MPa in terms of maintaining the rigidity of the protective film. In addition, the silicone rubber preferably has a heat resistance of 175° C. or more. The heat resistance here is a temperature at which the silicone rubber is not pyrolyzed, and this means that when the semiconductor module is formed, the dielectric breakdown voltage does not decrease after the semiconductor module is allowed to stand at a predetermined temperature for 6000 h. Silicone rubbers mainly include a room temperature-curable type by a condensation reaction, and a thermally curable type and a UV-curable type by an addition reaction according to the curing process, but the silicone rubber does not depend on the type of these curing processes as long as it has the predetermined physical property values. In addition, silicone rubbers include some types according to the type and structure of the side chain, but in order to obtain the effect of the present invention, the type and structure of the side chain are not particularly limited, and the condition of the predetermined physical property value $A_2$ should be satisfied.

The protective layer 21 preferably includes an inorganic filler as an optional component. When the protective layer 21 includes the inorganic filler, the value of $A_2$ increases, and the power cycle resistance of the semiconductor device can be increased. The amount of the inorganic filler added is preferably 50 parts by mass to 200 parts by mass, and more preferably 50 parts by mass to 150 parts by mass, based on 100 parts by mass of the silicone rubber. Cases in which the amount of the inorganic filler added is less than 50 parts by mass and more than 200 parts by mass may lead to a small effect of increasing the value of $A_2$ and not contribute to an increase in P/C resistance.

The compound species constituting the inorganic filler added to the protective layer 21 can be selected from the same range of choices as the inorganic filler added to the sealing layer 20 and is not particularly limited. Two or more different compound species can also be mixed and used. The shape of the inorganic filler is not particularly limited, and an inorganic filler having a spherical shape, a crushed shape, a fibrous shape, a plate-like shape, or the like can be used. In particular, a plate-like inorganic filler having a large aspect ratio is preferred because with the plate-like inorganic filler having a large aspect ratio, cracks are less likely to occur in the protective layer, and the effect of improving the reliability of the semiconductor module is obtained. Even when cracks occur, the cracks stop at the major surfaces of the inorganic filler, and the effect of preventing further growth and extension of the cracks is obtained. As used herein, the aspect ratio of the plate-like inorganic filler can be defined as the values of b/a and a/c when the length of the major axis or the long side constituting the major surface of the plate-like body is a, the length of the minor axis or the short side is b, the length of the shortest side corresponding to the plate thickness is c, and b≥a>c is set. The b/a may be 1 to 100 and is preferably 1 to 20. In addition, a/c may be 10 to 100 and is preferably 20 to 50. Plate-like inorganic fillers include a scale-like inorganic filler as a further preferred mode. The scale-like inorganic filler can refer to an inorganic filler having a shape in which at least part of the outer shape is formed by a curve, such as the shape of the major surface being an ellipse, a circle, a fan shape, a shape formed by bending these, or the like. In the scale-like inorganic filler, when the major axis of the major surface is A, and the length of the shortest side corresponding to the thickness is C, A/C may be 10 to 10,000 and is preferably 100 to 2,000. Specific examples of the scale-like inorganic filler include isinglass.

The average particle diameter or major axis of the inorganic filler is, for example, preferably about 1 μm to 50 μm, and more preferably about 10 μm to 40 μm, from the viewpoint of dispersibility. The major axis of the plate-like or scale-like inorganic filler or the like may be the major axis a or A of the major surface.

The protective layer 21 may also include optional additives in a range that does not impair its characteristics. Examples of the additives include, but are not limited to, a flame retardant and a pigment for coloring.

In the sealing material, the sealing layer 20 and the protective layer 21 that satisfy the previous conditions of the parameters $A_1$ and $A_2$ should be disposed in contact with each other, and the protective layer 21 may include a plurality of layers including a silicone rubber and having physical property values that satisfy the previous relational expression of the parameters $A_1$ and $A_2$. For example, a second protective layer may be provided on the outside (the major surface opposite to the sealing layer 20) of the illustrated protective layer 21, and a third protective layer may be provided on the outside of the second protective layer. The material compositions of the second protective layer and the third protective layer both satisfy the material composition of the protective layer 21, and when the parameter of the second protective layer is $A_3$, and the parameter of the third protective layer is $A_4$, the relational expression of $A_2 < A_3 < A_4$ is preferably satisfied, and the relational expression of $A_2 < A_3 < A_4 < A_1 *25$ is more preferably satisfied. For example, the protective layer 21 can be a silicone rubber cured product including no inorganic filler, and the second and third protective layers can each be a silicone rubber cured product including an inorganic filler, but they are not limited to particular compositions. The sealing layer 20 may also include a plurality of layers that are each the previously defined thermosetting resin cured product and have physical property values that satisfy the previous relational expression of the parameters $A_1$ and $A_2$.

Next, the manufacture of the illustrated power semiconductor module will be described. The heat sink 13, the laminated substrate 12, and the semiconductor element 11 are bonded, the case 16 is attached to the heat sink 13, and then the bonding of the lead frame 18, and wire bonding with the aluminum wire 14 are performed. Then, a thermosetting resin composition constituting the sealing layer 20 is injected into the case 16 and heat-cured. The step of heat curing can be, for example, two-step curing. When an epoxy resin is used as the thermosetting resin main agent, the thermosetting resin composition is heated at 90 to 120° C. for 1 to 2 h to a semi-cured state. Subsequently, heating can be further carried out at 175 to 185° C. for 1 to 2 h (full curing). But the two-step curing is not limited to particular temperatures and times, and it may not be necessary.

Then, a silicone rubber composition constituting the protective layer 21 is applied and formed so as to be in contact with the sealing layer 20 in the case 16 and is cured. A room temperature-curable silicone rubber composition is cured by a condensation reaction due to moisture, and therefore, it may be maintained at a constant temperature and humidity of room temperature (about 15° C. to 25° C.) and about 40% RH to 60% RH for a predetermined time (for example, about 1 day to 1 week). A heat-curable type may be maintained at approximately 100° C. to 200° C. for about 0.5 h to 5 h, and a plurality of heating steps may be provided. But the conditions of curing are not limited to a particular temperature, humidity, and time. Depending on the mode of the protective layer 21, the protective layer 21 may be formed after the sealing layer 20 is completely cured, or the protective layer 21 may be formed in a state in which the sealing layer 20 is temporarily cured. For the order of lamination and curing when the protective layer 21 includes a plurality of layers, a plurality of protective layers may be laminated and then cured, or the protective layers may be cured and then laminated.

As a variation of the illustrated power semiconductor module, the power semiconductor module may include a primer layer at the interface between the members to be sealed including the laminated substrate, the semiconductor element, and the electrically conductive connecting members and the sealing material. The primer layer may be preferably used at the interface between the sealing material and the members to be sealed, from the viewpoint of ensuring adhesion. The primer layer may be a layer including a resin including a polyamide, a polyimide, or a polyamide-imide. The thickness of the primer layer is not particularly limited as long as adhesion can be provided. The thickness of the primer layer can be, for example, about 1 to 20 μm, and is preferably 1 to 10 μm. The range is more preferred because the primer layer also has the effect of stress relaxation, and therefore, the adhesion can be improved. The primer layer can be provided so as to coat the entire surfaces of the semiconductor element 11, the laminated substrate 12, the lead frame 18, and the aluminum wire 14 shown in FIG. 1.

In the method for manufacturing the power semiconductor module including the primer layer, the members to be sealed are assembled, and then the primer layer is formed before the sealing material is injected. The primer layer can be provided on the entire surfaces of the members to be sealed including the semiconductor element 11, the lead frame 18, the laminated substrate 12, the aluminum wire 14, and the case 16 shown in FIG. 1, for example, by spraying, an immersion method, or application by a dispenser. After the formation of the primer layer, the assembly is preferably heated in stages at 70 to 100° C. for about 60 min to 80 min and is further heated at 200 to 220° C. for 60 to 80 min in an inert oven into which nitrogen gas is introduced. By this heating operation, the Cu constituting the lead frame 18 can be heated, and the solvent can be vaporized to solidify the primer. After the formation of the primer layer, insulation and sealing with the sealing material can be performed as in the method for manufacturing the power semiconductor module shown in FIG. 1.

The configuration of the illustrated power semiconductor module is one example, and the present invention is not limited to the configuration. For example, an optional electrically conductive connecting member may be used, and an implant pin can also be used. A configuration in which the electrically conductive connecting member is only a lead frame or only a wire is also possible. When a primer layer is provided in a module in which the electrically conductive connecting member includes an implant pin, the primer layer can be formed on the implant pin surface. When a primer layer is provided in a module having a configuration in which the electrically conductive connecting member is only a wire, the primer layer can be formed on the wire surface.

A caseless power semiconductor module not having a case may be used. Examples of the structure of the caseless power semiconductor module include a structure in which the caseless power semiconductor module includes an implant pin and a printed substrate bonded to the implant pin, instead of the lead frame and the aluminum wire in FIG. 1, and members including these are sealed with a sealing material, not illustrated. As the printed substrate, a polyimide film substrate or an epoxy film substrate on which an electrically conductive layer such as Cu or Al is formed can be used. As the implant pin, a copper pin including copper can be used. Both the electrically conductive layer of the printed substrate and the implant pin may be of Cu or Al subjected to treatments such as Ni plating for the purpose of corrosion prevention and the like. This printed substrate and implant pin electrically connect semiconductor elements or a semiconductor element and a laminated substrate. The implant pin and the laminated substrate or the semiconductor element can be bonded by a solder bonding layer. The implant pin can be an external connecting terminal by drawing out the implant pin from the laminated substrate to the outside of the sealing material. In the manufacture of the power semiconductor module in such a mode, members to be sealed including a laminated substrate, a semiconductor element, an implant pin, and a printed substrate are assembled, a primer layer is optionally formed on the surfaces of the laminated substrate, the semiconductor element, the implant pin, and the printed substrate by a method such as spray application, then the members to be sealed are placed in a suitable mold, and a thermosetting resin composition constituting a sealing layer is filled into the mold and temporarily cured. Examples of such a sealing body molding method include vacuum casting, transfer molding, liquid transfer molding, and potting, but are not limited to the predetermined molding methods. Then, a silicone rubber composition is applied by a spray or a dispenser to form a protective layer, and is fully cured. Also in the caseless power semiconductor module, a mode in which the sealing layer is not in contact with the air and is covered with the protective layer is preferred. Also, in the caseless power semiconductor module, by forming a protective layer that satisfies the predetermined physical property conditions on the surface of the sealing layer, it is possible to provide a semiconductor device having high reliability in which even when cracks occur in the sealing layer, the protective layer prevents moisture entry into the sealing layer.

According to the semiconductor device according to this embodiment, it is possible to provide a semiconductor device having high reliability in which even when cracks occur in part of a sealing material, a protective layer can prevent the entry of moisture.

EXAMPLES

The present invention will be described in more detail below by giving Examples of the present invention. But the present invention is not limited to the scope of the following Examples.

1. Mechanical Characteristics of Protective Layer and Reliability (P/C resistance)

The power semiconductor module having a two-layer sealing structure of a sealing layer and a protective layer shown in FIG. 1 was manufactured with the material of the protective layer changed, and subjected to moisture absorption treatment, and then the reliability was evaluated. In addition, the physical properties of the resin cured products constituting the sealing layers and the protective layers used in the Examples and Comparative Examples were evaluated, and the relationships with reliability were examined.

The sealing layer was an epoxy resin cured product. As the epoxy resin main agent, an epoxy resin ME-276 (manufactured by Pelnox, Ltd.) was used, and 121 parts by mass of MV-138 (manufactured by Pelnox, Ltd.) as an acid anhydride-based curing agent was added based on 100 parts by mass of the main agent. For the inorganic filler, spherical silica having an average particle diameter of 10μm (manufactured by AGC Inc.) was used, and 270 parts by mass of the spherical silica was added when the total mass of the main agent of the epoxy resin and the curing agent was 100 parts by mass.

The protective layer was manufactured using a material shown in Table 1 or 2 without adding an inorganic filler. In Example 7, a 10 μm primer layer including HIMAL HL1200F (Showa Denko Materials Co., Ltd.), in which the main component was a polyamide, was formed on the laminated substrate, the semiconductor element, the lead frame, the wire, and the case.

TABLE 1

| | Examples | | | | | | |
|---|---|---|---|---|---|---|---|
| | Example 1 | Example 2 | Example 3 | Example 4 | Example 5 | Example 6 | Example 7 |
| Protective layer material | Silicone rubber | | | | | | |
| Protective layer material product | Shin-Etsu X-31-2850 | Momentive TSE322SK | Shin-Etsu LPS3412 | Shin-Etsu KE-4948-G RTV silicone rubber | Shin-Etsu LPS5575 | Momentive TSE325 | Shin-Etsu X-31-2850 |
| Elastic modulus 25° C. (MPa) | 2 | 5 | 70 | 65 | 350 | 1246 | 2 |
| Tensile strength $T_2$(MPa) | 3 | 3 | 11 | 2 | 7 | 1 | 3 |
| Elongation at break $E_2$(%) | 510 | 440 | 100 | 400 | 60 | 210 | 510 |
| $T_2 \times E_2$(A2) | 1530 | 1320 | 1100 | 800 | 420 | 210 | 1530 |
| Insulation (kV/mm) | 27 | 24 | 27 | 25 | 30 | 21 | 27 |
| Film thickness (μm) | 200 | 200 | 200 | 200 | 200 | 200 | 200 |
| P/C resistance (number of cycles) | 150 | 180 | 180 | 250 | 260 | 240 | 180 |
| Reliability: insulating properties after $T_j$P/C (when 200 kilocycles is reached) | sufficient | sufficient | sufficient | sufficient | sufficient | sufficient | sufficient |
| Primer layer | No | No | No | No | No | No | Yes |

TABLE 2

| | Comparative Examples | | | | |
|---|---|---|---|---|---|
| | Comparative Example 1 | Comparative Example 2 | Comparative Example 3 | Comparative Example 4 | Comparative Example 5 |
| Protective layer material | No protective layer | Epoxy resin (containing filler) | Silicone gel | Modified silicone | UV-curable silicone |

TABLE 2-continued

| | Comparative Examples | | | | |
|---|---|---|---|---|---|
| | Comparative Example 1 | Comparative Example 2 | Comparative Example 3 | Comparative Example 4 | Comparative Example 5 |
| Protective layer material product | — | Pelnox ME272/HV136 | DuPont Toray Specialty Materials SE1885 | Shin-Etsu Chemical SCR-1016 | Shin-Etsu Chemical KER-4000 |
| Elastic modulus 25° C. (MPa) | — | 10000 | 0.015 | 1400 | 2 |
| Tensile strength $T_2$ (MPa) | — | 100 (Bending strength) | Unmeasurable | 25 (Bending strength) | 4.8 |
| Elongation at break $E_2$(%) | — | 1 | Unmeasurable | Unmeasurable | 1 |
| $T_2 \times E_2(A_2)$ | — | 100 | — | — | 4.8 |
| Insulation (kV/mm) | — | — | 17 | 32 | — |
| Film thickness (μm) | — | 200 | 200 | 200 | 200 |
| P/C resistance (number of cycles) | 15 | 16 | 9 | 18 | 20 |
| Reliability: insulating properties after $T_jP/C$ (when 200 kilocycles is reached) | not sufficient | not sufficient | not sufficient | not sufficient | not sufficient |

In the manufacture of each of the power semiconductor modules of the Examples and the Comparative Examples, members to be sealed were assembled, and then for Example 7, a primer layer was formed. After the formation of the primer layer, the assembly was heated at 100° C. for 60 min and further heated at 200° C. for 60 min in an inert oven into which nitrogen gas was introduced. By this heating operation, the oxidation of the Cu surface was suppressed, and the Cu constituting the lead frame and the like was heated to promote the reaction of the primer layer with the Cu to improve the adhesion between the primer layer and the lead frame and the like. Then, the thermosetting resin composition constituting the sealing layer 20 was injected into the case 16 and heat-cured. In the step of heat curing, the thermosetting resin composition was heated at 120° C. for 1 h to a semi-cured state, and furthermore, heating was carried out at 175° C. over 1 h. Then, a silicone rubber composition constituting a protective layer was applied by a dispenser and was cured. The conditions of curing were as shown in the following Table 3.

TABLE 3

| Examples and Comparative Examples | Curing conditions | | |
|---|---|---|---|
| | First step | Second step | Third step |
| Examples 1 and 7 | 23° C., 50% RH, 24 h | — | — |
| Example 2 | 100° C., 1 h | — | — |
| Example 3 | 60° C., 2 h | 150° C., 4 h | — |
| Example 4 | 23° C., 50% RH, 10 min | — | — |
| Example 5 | 80° C., 2 h | 100° C., 1 h | 150° C., 4 h |
| Comparative Example 2 | 170° C., 1 h | — | — |
| Comparative Example 3 | 120° C., 2 h | — | — |
| Comparative Example 4 | 70° C., 1 h | 150° C., 5 h | — |
| Comparative Example 5 | UV irradiation (illuminance 100 mW/cm², time 20 sec, accumulated amount of light 2000 mJ/cm²) | | |

The manufactured power semiconductor module was allowed to stand at 85° C. and 85% RH for 300 h for moisture absorption treatment. The moisture absorption treatment was performed in order to simulate moisture absorption conditions at the same level as the saturated water absorption of the product after manufacture, rather than the power semiconductor module immediately after manufacture. The sealing material and the case material constituting the product have the property of absorbing water, and the saturated water absorption refers to a state in which the water absorption rate substantially reaches saturation. Then, the reliability of the power semiconductor module after the moisture absorption treatment was evaluated by $T_j$ power cycle resistance ($T_jP/C$ resistance). In the power cycle test, the number of cycles until the electrical characteristics reached an abnormal value was examined at 40 to 175° C. ($\Delta T_j$135° C.) with the conditions of an energization operation of 2 s and a stop of 9 s as 1 cycle. In order to obtain sufficient reliability, 50 or more kilocycles are needed. The insulating properties were evaluated by an insulation test. Specifically, when no dielectric breakdown (sharp increase in current that did not follow Ohm's law) occurred when a prescribed voltage was applied for a prescribed time with an alternating voltage or a direct current voltage 10 times to 20 times the usually handled voltage, it was determined that the insulator had sufficient dielectric strength.

Tables 1 and 2 show the evaluation results of the elastic modulus, tensile strength $T_2$, elongation at break $E_2$, strength ×elongation at break $A_2$, insulating properties, and film thickness of the protective layer, $T_jP/C$ resistance, and reliability in the Examples and the Comparative Examples. The unit of the $T_jP/C$ resistance is kilocycles. For the sealing layer, the same material as in Comparative Example 2 was used in common in all the Examples and the Comparative Examples, and the tensile strength $T_1$ was 100 MPa, the elongation at break $E_1$ was 1%, and the strength ×elongation at break $A_1$ was 100 MPa.

(1) Elastic Modulus of Protective Layer and Reliability

Figure 2:
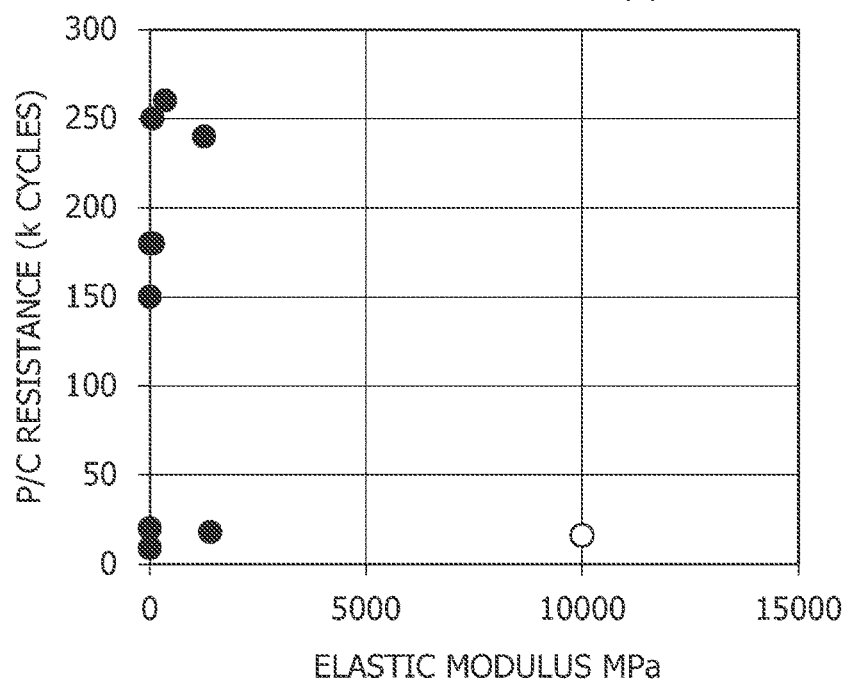
FIG. 2 is a graph obtained by plotting the elastic modulus of a protective layer on the horizontal axis and the power cycle resistance (P/C resistance) of a power semiconductor module after moisture absorption treatment on the vertical axis.
Figure 3:
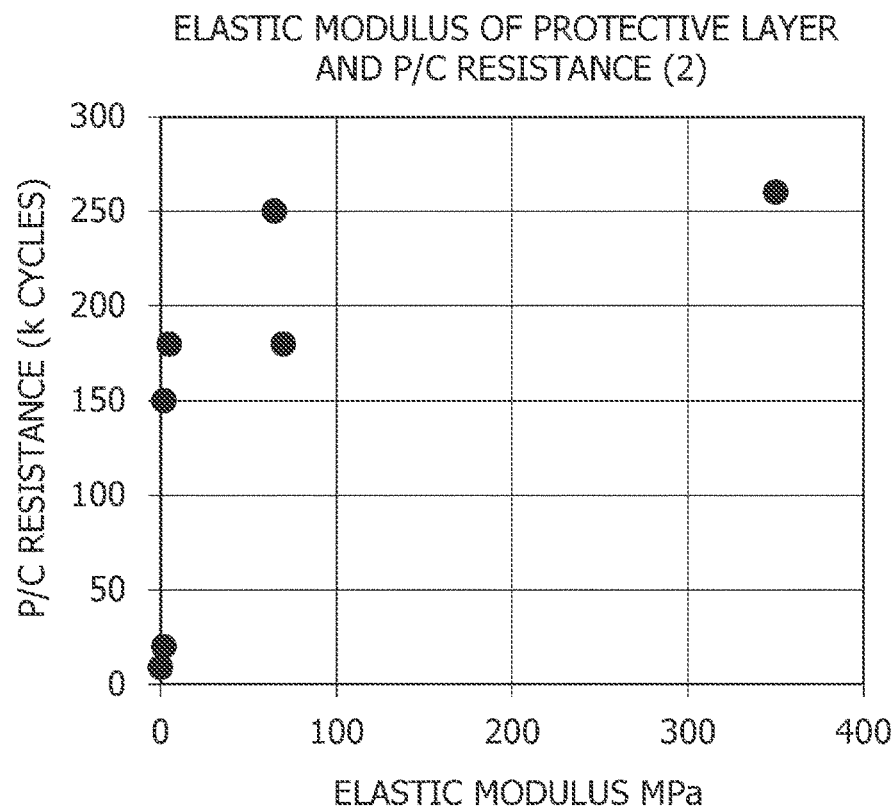
FIG. 3 shows a graph showing the range of the elastic modulus on the horizontal axis to 400 MPa, which is enlarged, excluding the epoxy resin of Comparative Example 2, Comparative Example 4, and Example 6 from FIG. 2.

For Examples 1 to 7 and Comparative Examples 1 to 5, the elastic modulus of the protective layer was plotted on the horizontal axis, reliability (P/C resistance) was plotted on the vertical axis, and evaluation was performed. FIG. 2 shows Examples and Comparative Examples in which the elastic modulus is in the range of 0 to 10000 MPa, and in FIG. 2, the unfilled circle ○ shows the result when an epoxy resin is used for the protective layer in Comparative Example 2. FIG. 3 shows Examples and Comparative Examples in which the elastic modulus is in a low range, in the range of 0 to 400 MPa, in FIG. 2. Therefore, FIG. 3 corresponds to a part obtained by excluding the epoxy resin of Comparative Example 2, Example 6, and Comparative Example 4 from FIG. 2. From FIGS. 2 and 3, it was shown that there was no clear correlation between the elastic moduli of the various protective layers and reliability (P/C resistance).

(2) Tensile Strength of Protective Layer and Reliability

Figure 4:
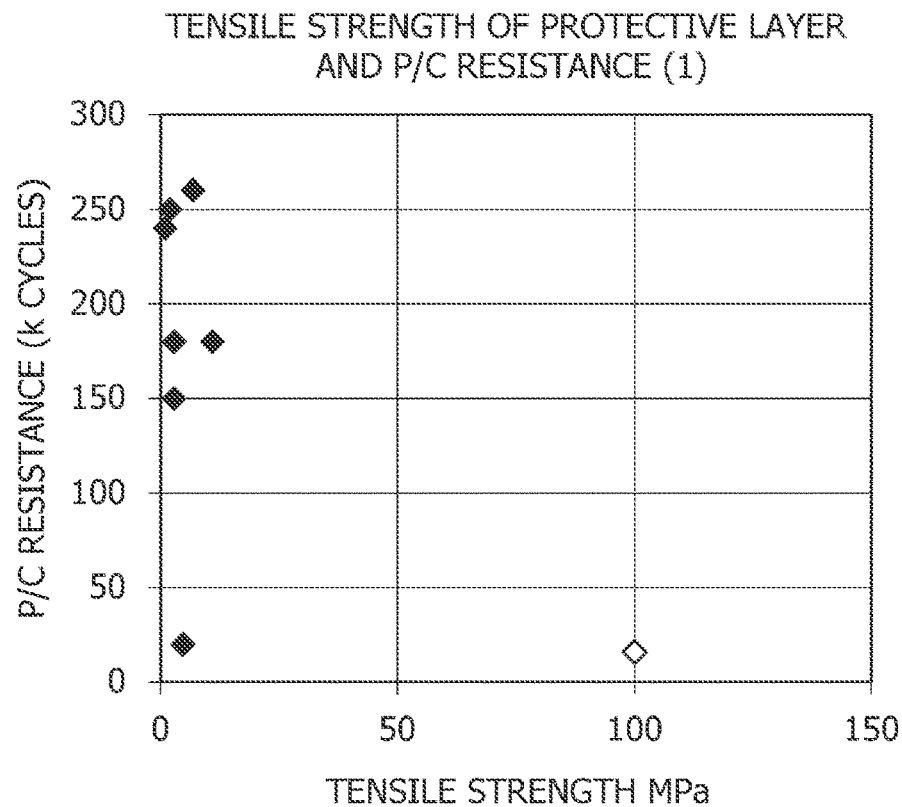
FIG. 4 is a graph obtained by plotting the tensile strength $T_2$ of a protective layer on the horizontal axis and the P/C resistance of a power semiconductor module after moisture absorption treatment on the vertical axis.
Figure 5:
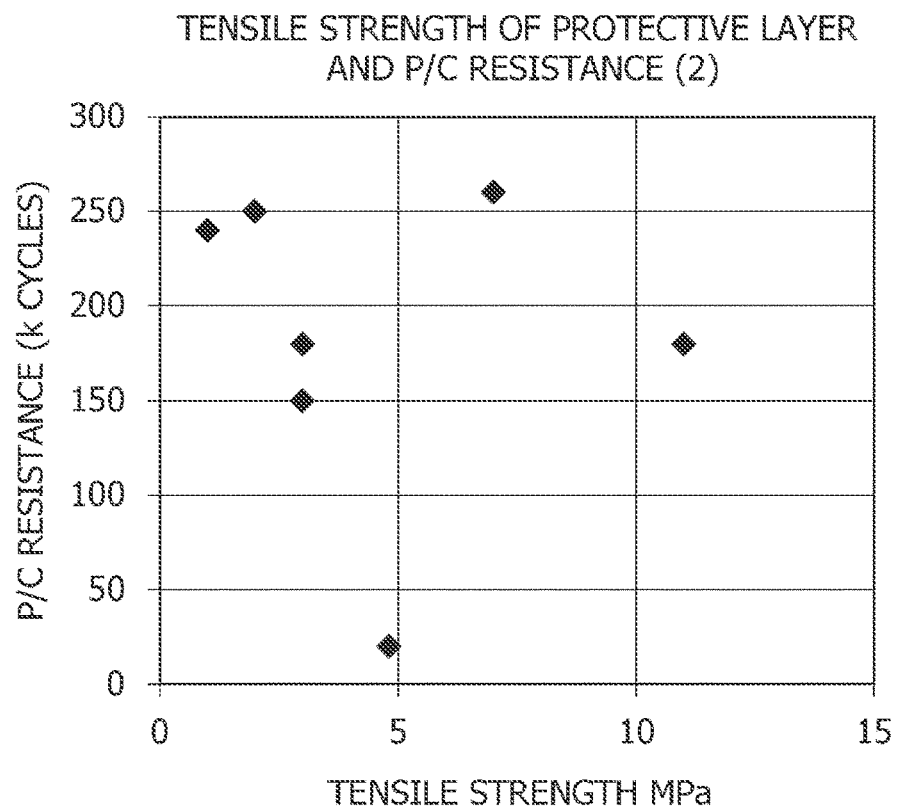
FIG. 5 shows a graph showing the range of the tensile strength on the horizontal axis to 15 MPa, which is enlarged, excluding the epoxy resin of Comparative Example 2 from FIG. 4.

For Examples 1 to 7 and Comparative Examples 2 and 5, the tensile strength of the protective layer was plotted on the horizontal axis, reliability (P/C resistance) was plotted on the vertical axis, and evaluation was performed. FIG. 4 shows Examples and Comparative Examples in which the tensile strength is in the range of 0 to 150 MPa, and in FIG. 4, the unfilled diamond ◇ shows the result when an epoxy resin is used for the protective layer in Comparative Example 2. FIG. 5 shows Examples and Comparative Examples in which the tensile strength is in a low range, in the range of 0 to 15 MPa, in FIG. 4. Therefore, FIG. 5 corresponds to a portion obtained by excluding the epoxy resin of Comparative Example 2 from FIG. 4. From FIGS. 4 and 5, it was shown that there was also no correlation between the tensile strength of the various protective layers and reliability (P/C resistance).

(3) Elongation at break of Protective Layer and Reliability

Figure 6:
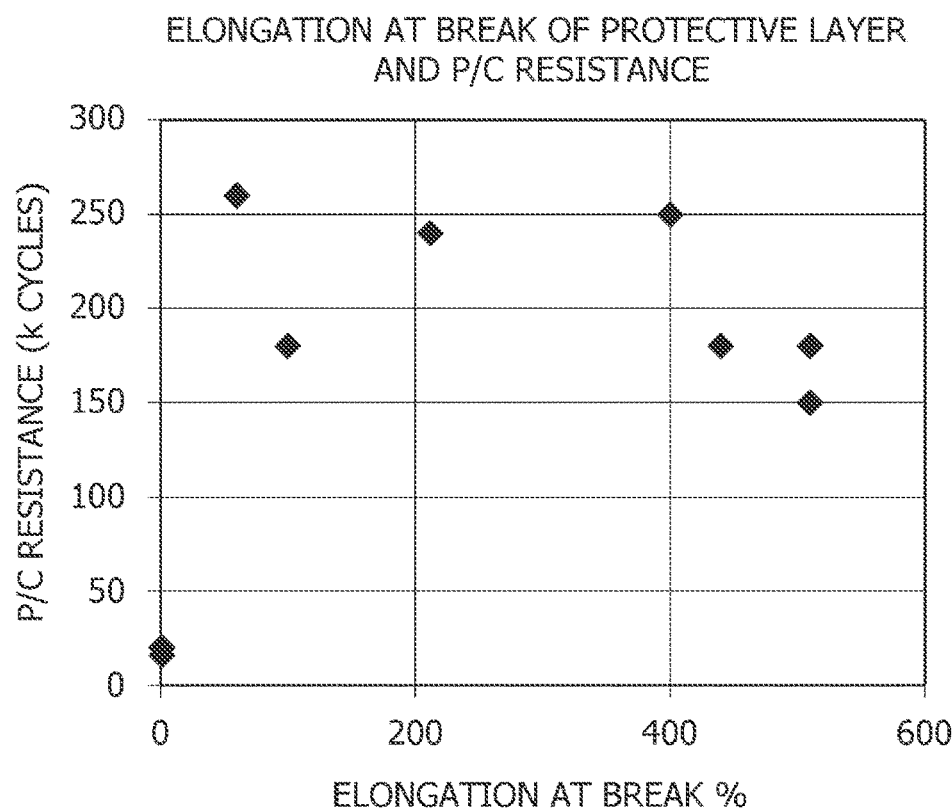
FIG. 6 is a graph obtained by plotting the elongation at break $E_2$ of a protective layer on the horizontal axis and the P/C resistance of a power semiconductor module after moisture absorption treatment on the vertical axis.

For Examples 1 to 7 and Comparative Examples 2 and 5, the elongation at break of the protective layer was plotted on the horizontal axis, reliability (P/C resistance) was plotted on the vertical axis, and evaluation was performed. The results are shown in FIG. 6. From FIG. 6, it was shown that there was also no clear correlation between the elongation at break of the various protective layers and reliability (P/C resistance).

Figure 7:
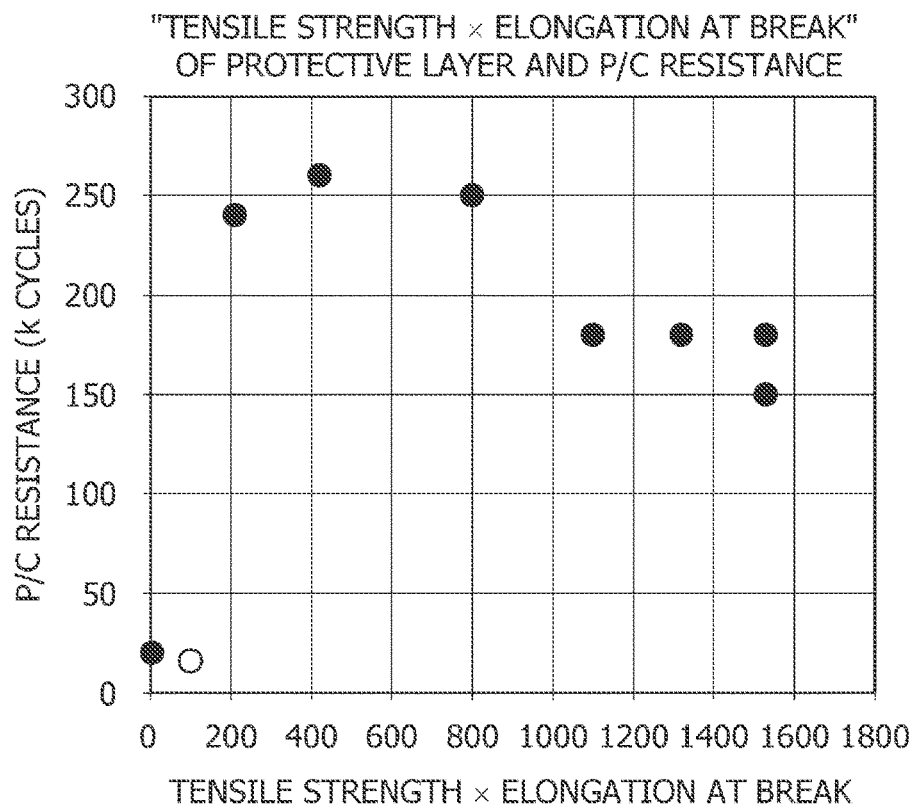
FIG. 7 is a graph obtained by plotting $A_2$ represented by the tensile strength ×elongation at break of a protective layer on the horizontal axis and the P/C resistance of a power semiconductor module after moisture absorption treatment on the vertical axis.

(4) "Tensile Strength ×Elongation at Break $A_2$" of Protective Layer and Reliability For Examples 1 to 7 and Comparative Examples 2 and 5, the "tensile strength ×elongation at break" of the protective layer was plotted on the horizontal axis, reliability (P/C resistance) was plotted on the vertical axis, and evaluation was performed. The results are shown in FIG. 7. In FIG. 7, the unfilled circle ○ shows the result when an epoxy resin was used for the protective layer in Comparative Example 2. From FIG. 7, a correlation was seen between the "tensile strength ×elongation at break $A_2$" of the protective layer and reliability (P/C resistance). The "tensile strength ×elongation at break $A_1$" of the sealing layer was the same as the value of Comparative Example 2. From FIG. 7, it was shown that when the condition $A_1<A_2$ was satisfied, the P/C resistance exceeded the preferred standard, and sufficient reliability was obtained. In addition, it was found that particularly when $A_2$ was less than 15 times $A_1$, the P/C resistance was more than 240 kilocycles, and high reliability was obtained. That is, it was found that when $A_2$ increased, the reliability did not increase monotonically, and when $A_2$ was too large, the reliability did not improve, and there was a preferred range. Specifically, it was found that when $A_2$ was 200 to 1600 MPa, the P/C resistance improved 5 times or more compared with the case in which there was no protective film, and further when $A_2$ was approximately 200 to 1000 MPa, the P/C resistance improved 10 times or more. The case in which A2 is approximately 200 to 1600 MPa corresponds to the case in which $A_2$ is less than 25 times $A_1$. These results show that the greater the product of the tensile strength and elongation at break of the protective layer is, the more the reliability of the module improves. From this, it is presumed that when the protective layer has such tensile strength that when thermal stress acts on the protective layer, and bending stress is applied, the protective layer does not crack immediately; and such characteristics that the protective layer endures without elongating or cracking easily even if a certain stress is applied (tensile strength), and has the ductility of elongating without cracking (elongation at break), reliability can be improved. That is, it is presumed that according to the present invention, the protective layer itself can protect the sealing layer without cracking.

When thermal stress was applied over time by repeated deformation in use of power semiconductor modules sealed with a sealing material including only an epoxy resin according to conventional art, cracking tended to occur, particularly upward from the ends of the lead frame or upward from the peripheral portion of the semiconductor element. The "upward" here refers to a direction from the semiconductor element toward the side opposite to the laminated substrate. Moisture often enters from such cracks, leading to dielectric breakdown in the lead frame portion or the portion of the semiconductor element. According to the present Examples, by using sealing layers and protective layers that satisfied the predetermined physical property conditions, sufficient P/C resistance was obtained.

2. Thickness of Protective Layer and Reliability (P/C resistance)

The P/C resistance after the moisture absorption treatment was evaluated using the protective layer material of Example 4 with the thickness of the protective layer changed. Peeling was evaluated by a scanning acoustic tomography (SAT). The results are shown in Table 4. From Table 4, when the thickness of the protective layer was 1.5 mm or more, peeling due to thermal stress occurred around the interface between the protective layer and the sealing resin layer. On the other hand, when the thickness of the protective layer is too thin, 20 μm, cracks in the epoxy resin may not be completely covered, and there may be thin parts in the protective layer, and the P/C resistance may be poor. The P/C resistance needs to be 20 or more kilocycles and is desirably 100 kilocycles or more. Therefore, cases in which the P/C resistance was 100 kilocycles or more were determined to be "excellent", and cases in which the P/C resistance was 20 kilocycles or more and less than 100 kilocycles were determined to be "satisfactory". When the protective film thickness was 20 μm or 1.5 μmm, the P/C resistance was 50 kilocycles and was determined to be "satisfactory". For the determination of peeling, mainly the vicinity of the interface between the surfaces of the members to be sealed such as the wiring members such as the lead frame, the semiconductor element, and the laminated substrate and the sealing layer, and the vicinity of the interface between the sealing layer and the protective layer were observed by SAT (Scanning Acoustic Tomography) and a cross-sectional SEM (Scanning Electron Microscope) for evaluation, and cases in which there were no peeling parts having a size of 10 μm or more were considered to be "excellent", and cases in which there were less than three peeling parts having a size of 10 μm or more and less than 30 μm were considered to be "satisfactory". From Table 4, it was found that the thickness of the protective film was more preferably 100 μm to 1 mm. Also in the case in which peeling was determined to be "satisfactory", the electrical characteristics as the semiconductor module were good as in the cases in which peeling was determined to be "excellent".

TABLE 4

|  | Protective layer thickness | | | | | |
| --- | --- | --- | --- | --- | --- | --- |
|  | 20 μm | 100 μm | 200 μm | 500 μm | 1 mm | 1.5 mm |
| P/C resistance (kilocycles) | 50 | 200 | 250 | 250 | 250 | 50 |
| P/C resistance determination | satisfactory | excellent | excellent | excellent | excellent | satisfactory |
| Peeling after 50 kilocycles | excellent | excellent | excellent | excellent | excellent | satisfactory |

3. Effect of Adding Inorganic Filler to Protective Layer

The parameter $A_2$, and the P/C resistance after the moisture absorption treatment were evaluated using the protective layer material of Example 4 with different types of inorganic fillers added in various amounts. Of the inorganic fillers used, $SiO_2$ was spherical silica having an average particle diameter of 30 μm, mica (muscovite) was a plate-like body in which the previously defined a, b, and c were 50, 200, and 2 respectively, and mica (phlogopite) was a scale-like body in which the previously defined A and C were 210 and 2 respectively. The evaluation results are shown in Table 5. The amount added is expressed in parts by mass when the amount of the silicone rubber constituting the protective layer is 100 parts by mass.

TABLE 5

|  | Inorganic filler | | | |
| --- | --- | --- | --- | --- |
|  | None | $SiO_2$ | Mica (muscovite) | Mica (phlogopite) |
| Amount added (parts by mass) | 0 | 100 | 100 | 100 |
| Protective film thickness (μm) | 200 | 200 | 200 | 200 |
| Tensile strength × elongation at break $A_2$ (MPa) | 800 | 900 | 1000 | 1050 |
| P/C resistance (kilocycles) | 250 | 270 | 320 | 290 |

From Table 5, it was confirmed that the scale-like and plate-like inorganic fillers (isinglass-based) had a greater value of the parameter $A_2$ and also higher P/C resistance than the spherical inorganic filler. This is presumed to be because when the plate-like or scale-like inorganic filler is added, cracks are less likely to form in the protective layer, and the protective layer itself is less likely to crack.

Figure 8:
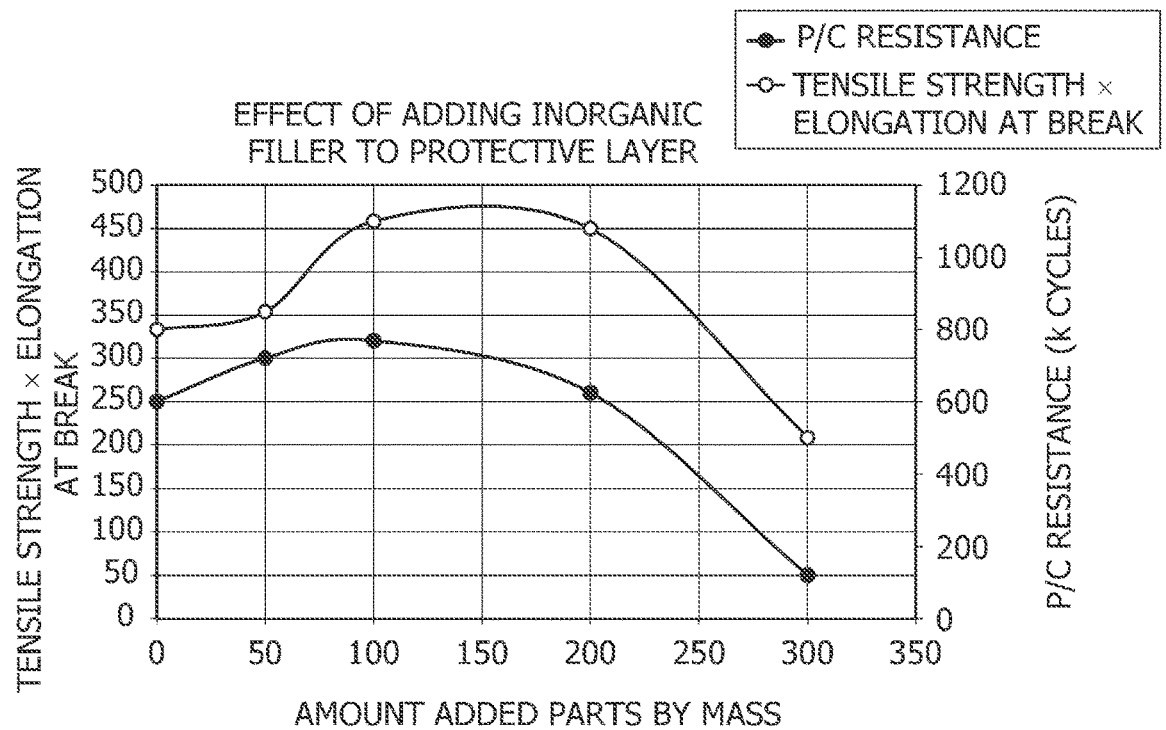
FIG. 8 shows the results of evaluating $A_2$ represented by the tensile strength ×elongation at break of a protective layer, and P/C resistance after moisture absorption treatment with the amount of mica (muscovite) added in the protective layer changed.

Next, the tensile strength ×elongation at break $A_2$ of the protective layer and the P/C resistance after the moisture absorption treatment were evaluated with varying the amount of mica (muscovite) added in the protective layer. The results are shown in FIG. 8. From FIG. 8, it was confirmed that the amount of the inorganic filler added was preferably 50 to 200 parts by mass when the amount of the silicone rubber constituting the protective layer was 100 parts by mass. When the amount of the inorganic filler added was small, the effect was small. When the amount of the inorganic filler added was too large, the "tensile strength ×elongation at break" decreased.

REFERENCE SIGNS LIST 11 semiconductor element, 12 laminated substrate, 121 electrically conductive plate,
122 insulating substrate, 123a, 123b electrically conductive plate,
13 heat sink, 14 aluminum wire, 15 external terminal, 16 case
17 bonding layer, 18 lead frame, 20 sealing layer, 21 protective layer

What is claimed is:

1. A semiconductor device comprising a semiconductor element mounted on a laminated substrate and an electrically conductive connecting member, and a sealing material which seals the semiconductor element and the electrically conductive connecting member, wherein
the sealing material comprises
a sealing layer that seals members to be sealed comprising the laminated substrate, the semiconductor element, and the electrically conductive connecting member and comprises a thermosetting resin, and
a protective layer coating the sealing layer and comprising a silicone rubber,
a value $A_1$ represented by a tensile strength ×elongation at break of the sealing layer is smaller than a value $A_2$ represented by a tensile strength ×elongation at break of the protective layer, and the value $A_2$ is 1600 MPa or less.

2. The semiconductor device according to claim 1, wherein the values $A_1$ and $A_2$ satisfy the following relationship:

$$A_1 < A_2 < A_1 * 25.$$

3. The semiconductor device according to claim 1, wherein the protective layer comprises an inorganic filler.

4. The semiconductor device according to claim 3, wherein the inorganic filler is a plate-like or scale-like inorganic filler.

5. The semiconductor device according to claim 1, wherein the protective layer has a thickness of 20 μm to 1000 μm.

6. The semiconductor device according to claim 3, wherein the thermosetting resin included in the sealing layer is an epoxy resin, the sealing layer further comprises a curing agent for the epoxy resin, and the curing agent is an acid anhydride-based curing agent.

7. The semiconductor device according to claim 1, comprising a primer layer at an interface between the members to be sealed and the sealing material.

8. The semiconductor device according to claim 7, wherein the primer layer is selected from a polyamide resin, a polyimide resin, and a polyamide-imide resin.

* * * * *

UNITED STATES PATENT AND TRADEMARK OFFICE
CERTIFICATE OF CORRECTION

| | |
|---|---|
| PATENT NO. | : 12,125,756 B2 |
| APPLICATION NO. | : 17/590289 |
| DATED | : October 22, 2024 |
| INVENTOR(S) | : Yuko Nakamata |

Page 1 of 1

It is certified that error appears in the above-identified patent and that said Letters Patent is hereby corrected as shown below:

In the Claims

Column 20, Line 45:
In Claim 1, delete "×elongation" and insert -- × elongation --.

Column 20, Line 47:
In Claim 1, delete "×elongation" and insert -- × elongation --.

Signed and Sealed this
Seventh Day of January, 2025

Derrick Brent
*Acting Director of the United States Patent and Trademark Office*